(12) United States Patent
Tsai et al.

(10) Patent No.: US 6,750,147 B2
(45) Date of Patent: Jun. 15, 2004

(54) PROCESS FOR INTEGRATION OF A TRENCH FOR CAPACITORS AND REMOVAL OF BLACK SILICON

(75) Inventors: Tzu-Ching Tsai, Taichung Hsien (TW); Frasier Wang, Taipei (JP)

(73) Assignee: Nanya Technology Corporation, Taoyuan (TW)

( * ) Notice: Subject to any disclaimer, the term of this patent is extended or adjusted under 35 U.S.C. 154(b) by 144 days.

(21) Appl. No.: 10/193,482

(22) Filed: Jul. 10, 2002

(65) Prior Publication Data
US 2003/0139052 A1 Jul. 24, 2003

(30) Foreign Application Priority Data
Jan. 18, 2002 (TW) ........................................ 91100819 A

(51) Int. Cl.[7] .............................................. H01L 21/302
(52) U.S. Cl. ...................... 438/694; 438/700; 438/717; 438/719; 438/723; 438/724
(58) Field of Search ................. 438/694, 717, 438/700, 719, 723, 724, 725

(56) References Cited

U.S. PATENT DOCUMENTS 6,291,315 B1 * 9/2001 Nakayama et al. ......... 438/459
6,383,936 B1 * 5/2002 Tsai et al. ................... 438/702
6,391,788 B1 * 5/2002 Khan et al. ................. 438/714
6,458,647 B1 * 10/2002 Tews et al. ................. 438/246
6,475,919 B2 * 11/2002 Brencher et al. ........... 438/714
6,489,249 B1 * 12/2002 Mathad et al. .............. 438/729

* cited by examiner

Primary Examiner—Nadine Norton
Assistant Examiner—Binh X. Tran
(74) Attorney, Agent, or Firm—Ladas & Parry

(57) ABSTRACT

A process for integration of a trench for capacitors and removal of black silicon. A semiconductor substrate is etched to form a capacitor trench having a predetermined depth, and black silicon spikes are generated on the semiconductor substrate at the edge region. A thermal oxide film is grown conformally on the capacitor trench. A sacrificial layer is then formed on the semiconductor substrate at the memory cell region, wherein the sacrificial layer is filled into the capacitor trench. The black silicon spikes are removed while the sacrificial layer is used as the shield. The sacrificial layer is partially removed to expose the thermal oxide film. The exposed thermal oxide film is then removed. Finally, the residual sacrificial structure is removed.

10 Claims, 5 Drawing Sheets

PROCESS FOR INTEGRATION OF A TRENCH FOR CAPACITORS AND REMOVAL OF BLACK SILICON

BACKGROUND OF THE INVENTION

1. Field of the Invention

The present invention relates to the manufacture of semiconductor devices, more particularly to a process for integration of a trench for the capacitor in Dynamic random access memories (DRAMs) and removal of black silicon.

2. Description of the Related Art

DRAM designs have been proposed which incorporate capacitors having vertical extensions below the surface of the silicon wafer (cylinder trench capacitors or bottle shaped trench capacitors). The trench for capacitors is formed by selectively etching the silicon wafer (semiconductor substrate). In the trench-etching step, so-called black silicon tends to be formed on the exposed silicon wafer at the edge or peripheral portion. The black silicon may be a silicon spike having a length of about 4 to 6 micrometers.

During subsequent processes, this black silicon can be broken off to form particles that become a cause of electrical insulation defects, having an adverse affect on manufacturing yield of DRAMs.

Therefore, improved methods to remove the black silicon during formation of the trench for capacitors are needed.

FIGS. 1A to 1F are cross-sections showing the manufacturing steps of a trench for capacitors in a semiconductor substrate, in accordance with the conventional skill.

FIG. 1A shows a semiconductor (silicon) substrate 10 having a memory cell region I and an edge region II. A hard mask HM consisting of pad oxide 12, silicon nitride 14, and boro-silicate glass layer 16 is formed on the semiconductor substrate 10. Next, the hard mask HM is used as the etching mask to etch the semiconductor substrate 10 to create a capacitor trench 18 by anisotropic reactive ion etching (RIE). In the step, black silicon spikes 22 are generated on the semiconductor substrate 10 at the edge region II without protection of the hard mask HM.

Next, as shown in FIG. 1B, a first photoresist material PR1 is covered on the semiconductor substrate 10 at the memory cell region I while exposing the upper surface of the semiconductor substrate 100 at the edge region II. As shown in FIG. 1C, the black silicon spikes 22 are then isotropically etched while the photoresist material PR1 is used as the etching mask to obtain a semiconductor substrate 10 having a rounded surface ES at the edge region II. The photoresist material PR1 is stripped and cleaned to expose the capacitor trench 18. A thermal oxide film 20 is formed on the capacitor trench 18 by thermal oxidation.

Referring now to FIG. 1D, a second photoresist material PR2 is spin coated on the semiconductor substrate 10 at the memory cell region I to fill the capacitor trench 18 having the thermal oxide film 20.

Next, as shown in FIG. 1E, the second photoresist material PR2 is partially etched to leave photoresist material PR2' at the bottom portion of the capacitor trench 18 and expose the thermal oxide film 20. The exposed thermal oxide film 20 is removed to leave thermal oxide film 20a at the bottom portion of the capacitor trench 18.

Afterward, referring to FIG. 1F, the photoresist material PR2 is stripped to expose the thermal oxide film 20a.

However, the conventional method of forming a trench for capacitors described above entails high processing complexity and costs (formation/removal of photoresist material PR1 and photoresist material PR2).

SUMMARY OF THE INVENTION

In view of the above disadvantages, an object of the invention is to provide a process for integration of a trench for capacitors and removal of black silicon without formation/removal of photoresist PR1 and photoresist PR2. Therefore, the process complexity and manufacturing cost can be reduced.

In accordance with one aspect of the invention, there is provided a process for integration of a trench for capacitors and removal of black silicon, suitable for a semiconductor substrate having a memory cell region and an edge region. First, an etching mask is formed on the semiconductor substrate. The semiconductor substrate is etched to form a capacitor trench having a predetermined depth while the etching mask is used as the shield, and black silicon spikes are generated on the semiconductor substrate at the edge region. A thermal oxide film is conformally grown on the capacitor trench. A sacrificial layer is then formed on the upper surface of the semiconductor substrate at the memory cell region, wherein the sacrificial layer is filled into the capacitor trench. The black silicon spikes are removed while the sacrificial layer is used as the shield. The sacrificial layer is partially removed to expose the thermal oxide film formed in the top portion of the capacitor trench and leave a sacrificial structure at the bottom portion of the capacitor trench. The exposed thermal oxide film is then removed. Finally, the residual sacrificial structure is removed.

In accordance with another aspect of the invention, there is provided a process for integration of a trench for capacitors and removal of black silicon. The formation of the etching mask further comprises the steps of:

growing a pad oxide on the semiconductor substrate;

depositing a silicon nitride on the pad oxide;

forming a silicon oxide layer/or boro-silicate glass on the silicon nitride;

selectively etching the silicon oxide layer/or boro-silicate glass, silicon nitride, and the pad oxide to create the stacked etching mask.

In accordance with further aspect of the invention, there is provided a process for integration of a trench for capacitors and removal of black silicon. The thermal oxide film in step (c) can be formed by thermal oxidation in an ambient containing oxygen or by chemical vapor deposition at an elevated temperature.

In accordance with yet another aspect of the invention, there is provided a process for integration of a trench for capacitors and removal of black silicon. The sacrificial layer preferably consists of an organic material or a photoresist material.

In accordance with a still further aspect of the invention, there is provided a method process for integration of a trench for capacitors and removal of black silicon. The formation of the capacitor trench in step (b) is preferably performed by ion reactive etching. Furthermore, the black silicon spikes are preferably removed by isotropic etching. Also, removal of the black silicon spikes and the sacrificial layer in steps (e) and (f) can be performed by the same etching tool.

BRIEF DESCRIPTION OF THE DRAWINGS

The preferred embodiment of the invention is hereinafter described with reference to the accompanying drawings in which.

DETAILED DESCRIPTION OF THE INVENTION

FIGS. 2A to 2D are cross-sections showing the manufacturing steps of a capacitor trench for a line space of 0.11 μm in a semiconductor substrate, in accordance with the embodiment of the invention.

Figure 1A:
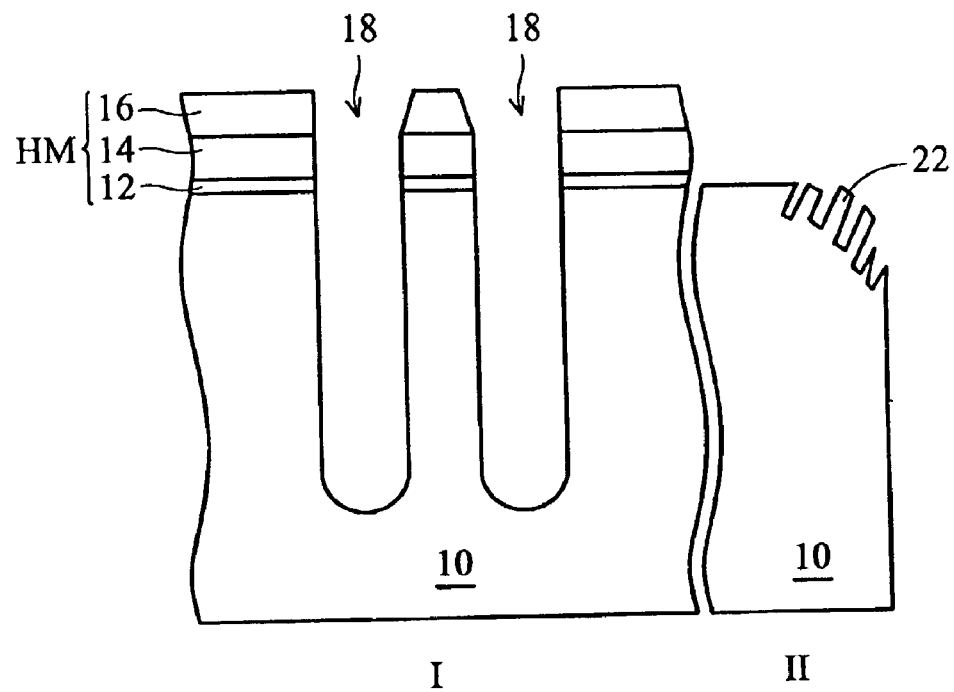
FIGS. 1A to 1F are cross-sections showing the manufacturing steps of a trench for capacitors in a semiconductor substrate, in accordance with the conventional skill.
Figure 1B:
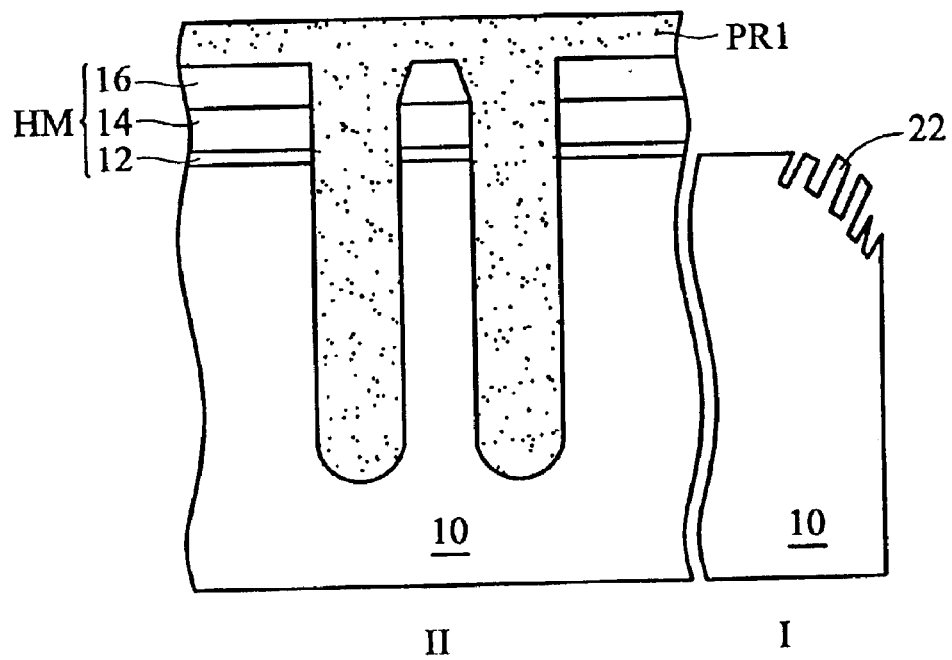
Figure 1C:
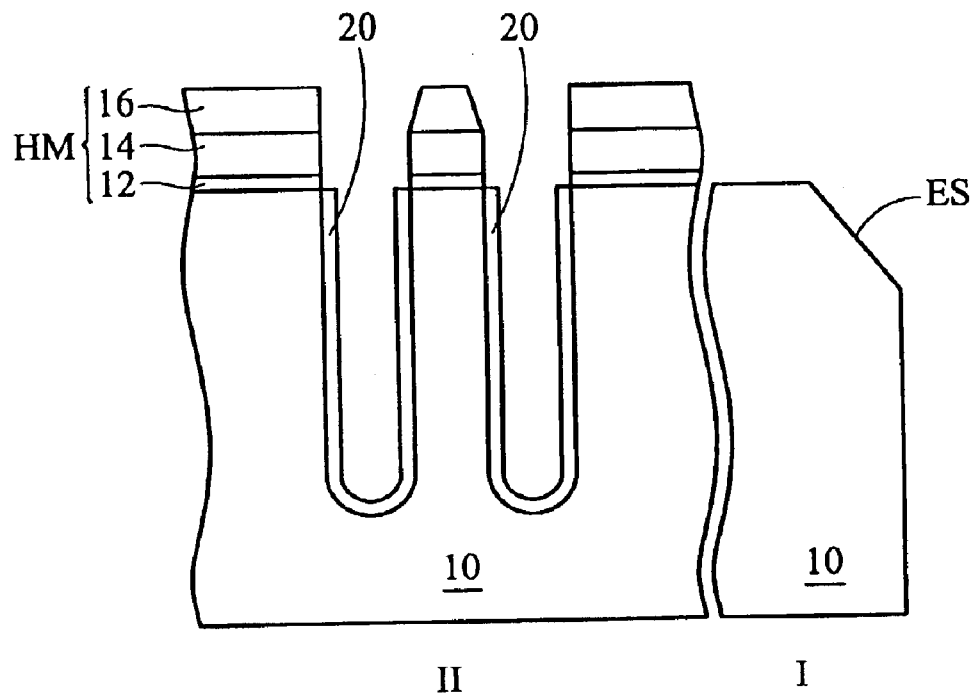
Figure 1D:
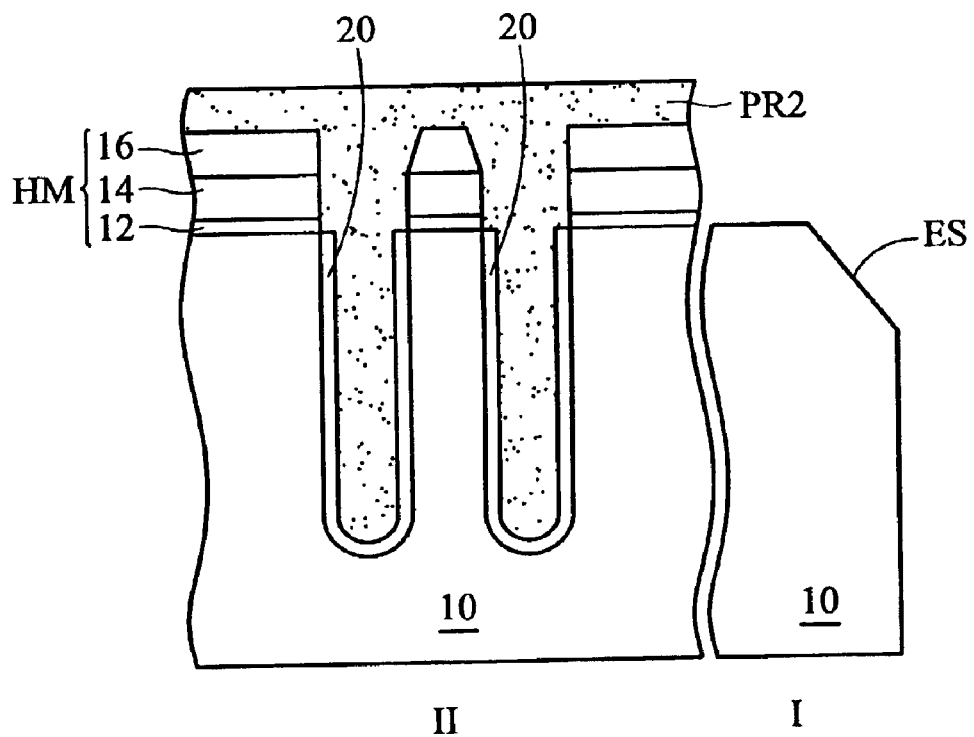
Figure 1E:
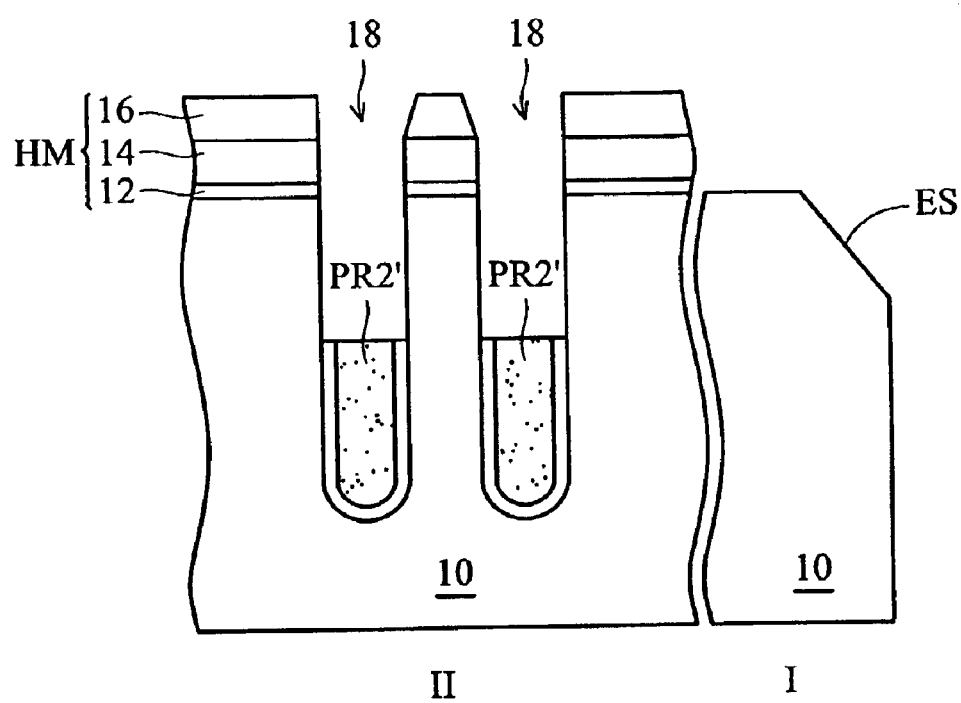
Figure 1F:
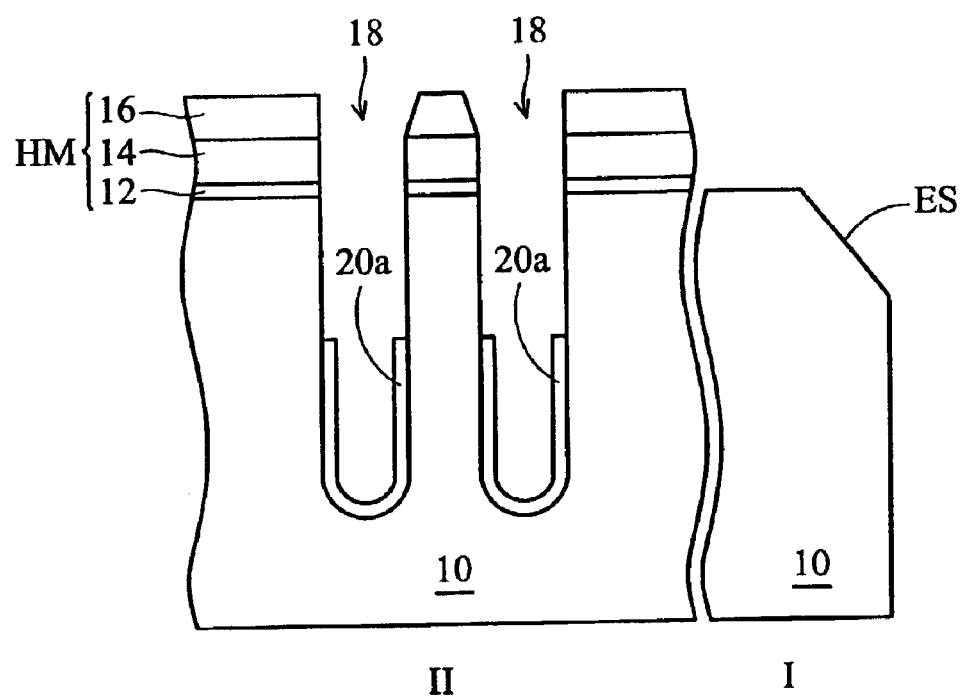
Figure 2A:
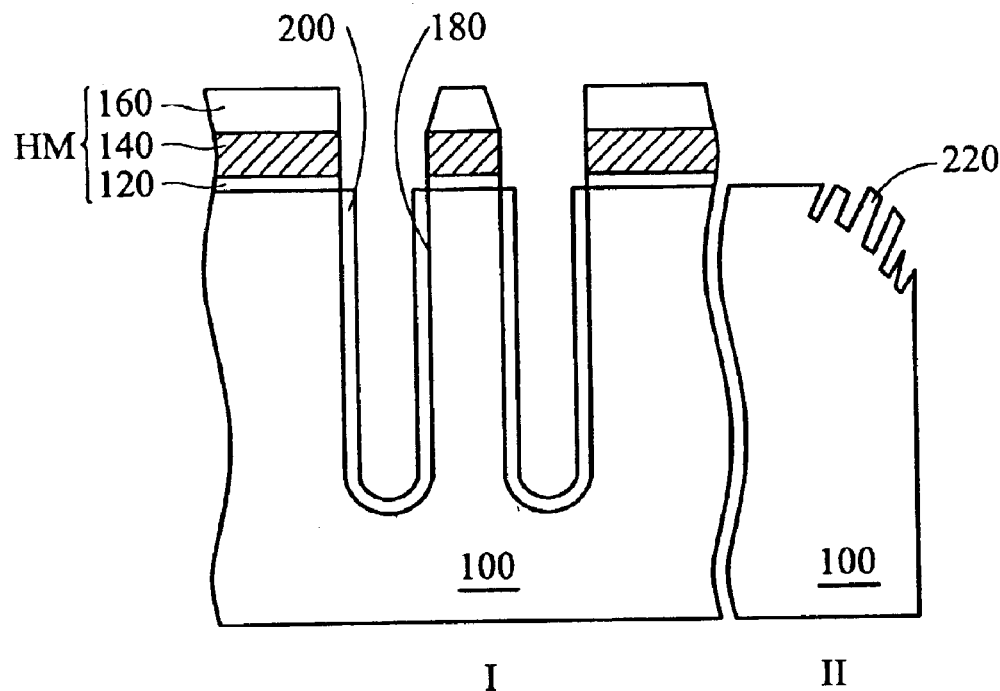
FIGS. 2A to 2D are cross-sections showing the manufacturing steps of a trench for capacitors in a semiconductor substrate, in accordance with the embodiment of the invention.

FIG. 2A shows a semiconductor (silicon) substrate 100 having a memory cell region I and an edge region II. A pad oxide 120 having a thickness of 100 to 1000 angstroms is formed on the semiconductor substrate 100 by thermal oxidation in an ambient including oxygen or water at temperatures in the neighborhood of 1,000° C. Next, a silicon nitride layer 140 and a boro-silicate glass layer 160 are sequentially deposited on the pad oxide 120 by low pressure chemical vapor deposition. The silicon nitride layer 140 has a thickness of about 500 to 1500 angstroms. Also, the boro-silicate glass layer 160 has a thickness of the about 2000 to 3000 angstroms. Then, the boro-silicate glass layer 160, the silicon nitride layer 140, and the pad oxide 120 are defined and etched by conventional photolithography comprising photoresist coating, photoresist exposure, and developing followed by an aniostropic etching so that the hard mask HM is created on the semiconductor substrate 100.

Next, the hard mask HM is used as the etching mask to etch the semiconductor substrate 100 to create a capacitor trench 180 having a depth of about 60000 to 80000 angstroms by anisotropic reactive ion etching (RIE). In the step, black silicon spikes 220 are generated at the edge region II and the sidewall of the semiconductor substrate 100 because of etching attack in the edge region II without protection of the hard mask HM.

Next, a thermal oxide film 200 is conformally grown on the capacitor trench 180 by thermal oxidation in an ambient including oxygen containing gas at a temperature of about 800 to 1000° C. Alternately, a rapid thermal oxide (RTO) film deposited by rapid thermal chemical vapor deposition can replace the thermal oxide film 120 by thermal oxidation.

Figure 2B:
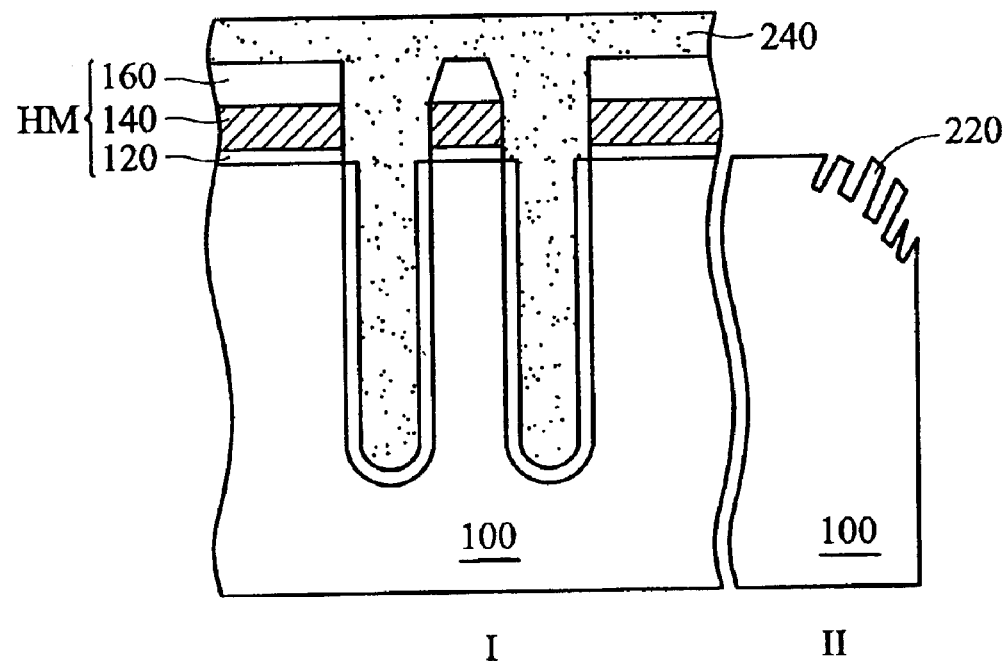

As shown in FIG. 2B, a sacrificial layer 240 such as an organic photoresist material is coated on the semiconductor substrate 100 at the memory cell region I to fill the capacitor trench 180. In this step, the black silicon spikes 220 are exposed at the edge region II.

Figure 2C:
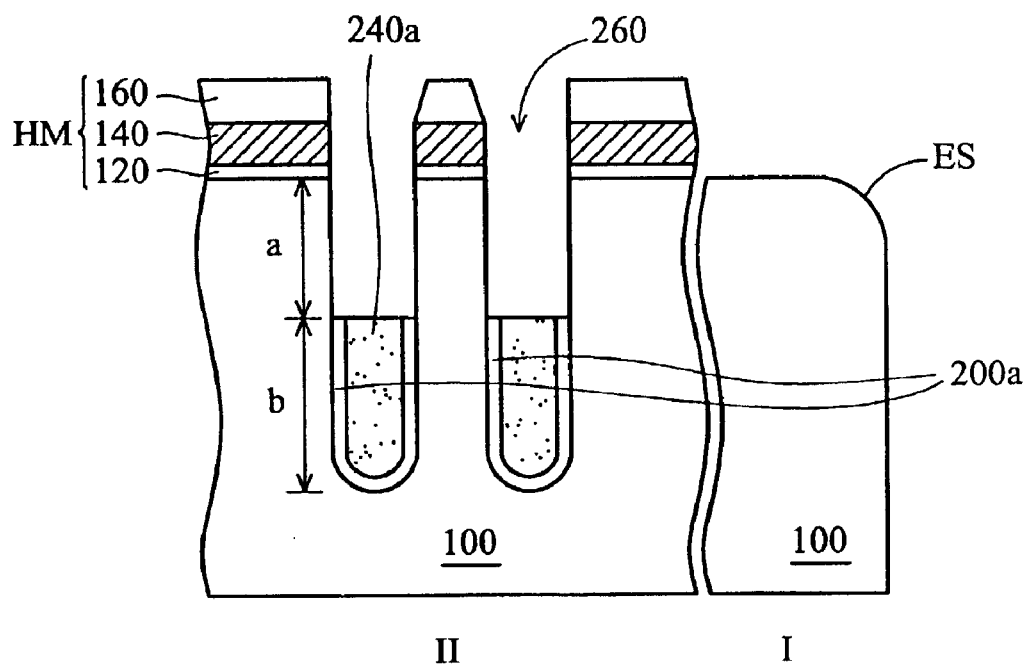

Afterward, referring to FIG. 2C, the semiconductor substrate 100 is placed into an etching tool chamber. The black silicon spikes 220 are isotropically etched to form a semiconductor substrate 100 having a rounded surface ES at the memory cell region I. The sacrificial layer 240 is partially etched in the same etching tool mentioned above by changing the reactant recipe to remove the sacrificial layer formed at the top portion a and leave a sacrificial structure 240a at the bottom portion b of the capacitor trench 180. The etching end point of this etching step is controlled by time-mode. Next, a thermal oxide film 200 is removed while the sacrificial structure 240a is used as the etching mask to leave a thermal oxide film 200a at the bottom portion b of the capacitor trench 180.

Figure 2D:
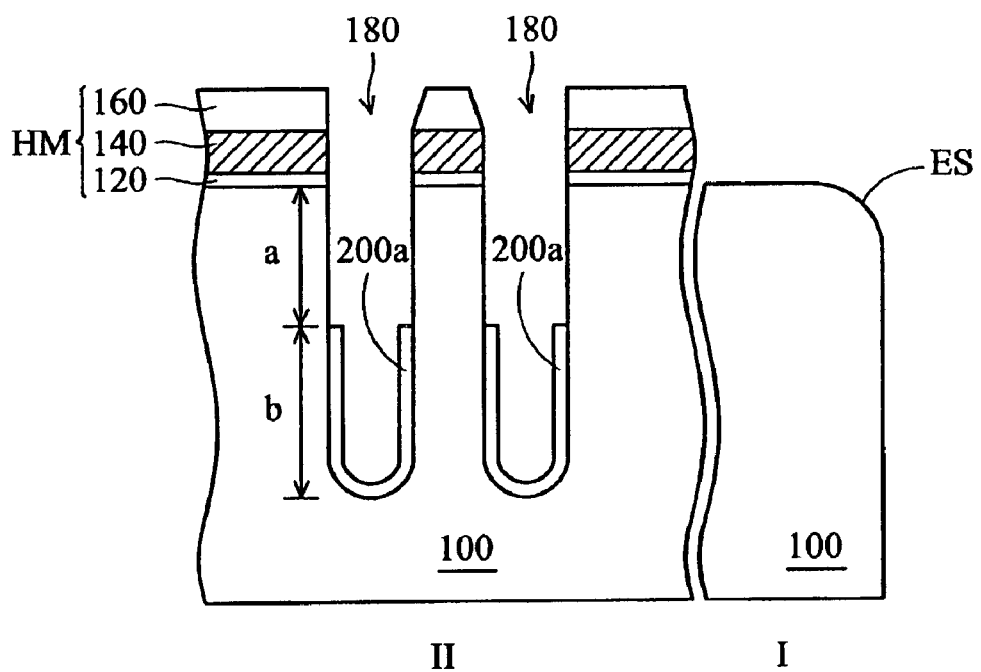

Turning now to FIG. 2D, the residual sacrificial structure 240a is removed in the same etching tool mentioned above to expose the thermal oxide film 200a.

Next, a silicon nitride (not shown) is formed on the top portion a of the capacitor trench 180 followed by removing the thermal oxide film 200a to expose the semiconductor substrate 100 at the bottom portion b of the capacitor trench 180 by the conventional method. The exposed semiconductor substrate 100 is etched by isotropic etching to create an enlarged trench such as bottle-shaped trench thus increasing the capacitance of a DRAM.

According to the embodiment of the invention, the sacrificial layer 240 can replace photoresist material PR1 and photoresist material PR2 mentioned as the conventional method. As a result, process complexity and manufacturing cost can be reduced.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A process for integration of a trench for capacitors and removal of black silicon, suitable for a semiconductor substrate having a memory cell region and an edge region, comprising the steps in sequence of:
   (a) forming an etching mask on the semiconductor substrate;
   (b) etching the semiconductor substrate to form a capacitor trench having a predetermined depth while the etching mask is used as the shield, and black silicon spikes being generated on the semiconductor substrate at the edge region;
   (c) conformally forming a thermal oxide film on the capacitor trench;
   (d) forming a sacrificial layer on an upper surface of the semiconductor substrate at the memory cell region, wherein the sacrificial layer is filled into the capacitor trench;
   (e) removing the black silicon spikes while the sacrificial layer is used as the shield;
   (f) removing a part of the sacrificial layer to expose the thermal oxide film formed in the top portion of the capacitor trench and leave a sacrificial structure at the bottom portion of the capacitor trench;
   (g) removing the exposed thermal oxide film; and
   (h) removing the residual sacrificial structure.

2. A process for integration of a trench for capacitors and removal of black silicon as claimed in claim 1, wherein the formation of the etching mask further comprises the steps of:
   growing a pad oxide on the semiconductor substrate;
   depositing a silicon nitride on the pad oxide;
   forming a silicon oxide layer on the silicon nitride;
   selectively etching the silicon oxide layer, silicon nitride, and the pad oxide to create the stacked etching mask.

3. A process for integration of a trench for capacitors and removal of black silicon as claimed in claim 1, wherein the formation of the etching mask further comprises the steps of:
   growing a pad oxide on the semiconductor substrate;
   depositing a silicon nitride on the pad oxide;
   forming a boro-silicate glass layer on the silicon nitride;
   selectively etching the boro-silicate glass layer, silicon nitride, and the pad oxide to create the stacked etching mask.

4. A process for integration of a trench for capacitors and removal of black silicon as claimed in claim 1, wherein the thermal oxide film in step (c) is formed by thermal oxidation in an ambient containing oxygen.

5. A process for integration of a trench for capacitors and removal of black silicon as claimed in claim 1, wherein the thermal oxide film in step (c) is formed by chemical vapor deposition.

6. A process for integration of a trench for capacitors and removal of black silicon as claimed in claim 1, wherein the sacrificial layer consists of an organic material or a photoresist material.

7. A process for integration of a trench for capacitors and removal of black silicon as claimed in claim 1, wherein the formation of the capacitor trench in step (b) is performed by ion reactive etching.

8. A process for integration of a trench for capacitors and removal of black silicon as claimed in claim 1, wherein the removal of the black silicon spikes in step (e) is performed by isotropic etching.

9. A process for integration of a trench for capacitors and removal of black silicon as claimed in claim 1, wherein the removal of the sacrificial layer in step (f) is performed by ion reactive etching.

10. A process for integration of a trench for capacitors and removal of black silicon as claimed in claim 1, wherein the removals of the black silicon spikes and the sacrificial layer in steps (e) and (f) are performed by the same etching tool.

\* \* \* \* \*